(12) United States Patent
Muramatsu et al.

(10) Patent No.: US 10,854,650 B2
(45) Date of Patent: Dec. 1, 2020

(54) LINEAR IMAGE SENSOR AND METHOD FOR MANUFACTURING SAME

(71) Applicant: HAMAMATSU PHOTONICS K.K., Hamamatsu (JP)

(72) Inventors: Norihiro Muramatsu, Hamamatsu (JP); Katsunori Nozawa, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 16/322,558

(22) PCT Filed: Jul. 25, 2017

(86) PCT No.: PCT/JP2017/026892
§ 371 (c)(1),
(2) Date: Feb. 1, 2019

(87) PCT Pub. No.: WO2018/030147
PCT Pub. Date: Feb. 15, 2018

(65) Prior Publication Data
US 2019/0189660 A1     Jun. 20, 2019

(30) Foreign Application Priority Data
Aug. 12, 2016   (JP) ................. 2016-158527

(51) Int. Cl.
*H01L 27/14* (2006.01)
*H01L 27/146* (2006.01)
(Continued)

(52) U.S. Cl.
CPC ........ *H01L 27/14618* (2013.01); *H01L 23/28* (2013.01); *H01L 25/042* (2013.01);
(Continued)

(58) Field of Classification Search
CPC .......... H01L 27/14634; H01L 31/0203; H01L 24/48; H01L 27/14618; H01L 27/14621;
(Continued)

(56) References Cited

U.S. PATENT DOCUMENTS

2008/0185709 A1*  8/2008  Ishihara .................. H01L 24/83
257/698

FOREIGN PATENT DOCUMENTS

| JP | S64-82851 A | 3/1989 |
|---|---|---|
| JP | H05-48061 A | 2/1993 |
| JP | 2013-150311 A | 8/2013 |

OTHER PUBLICATIONS

International Preliminary Report on Patentability dated Feb. 21, 2019 for PCT/JP2017/026892.

* cited by examiner

*Primary Examiner* — Moin M Rahman
(74) *Attorney, Agent, or Firm* — Faegre Drinker Biddle & Reath LLP

(57) ABSTRACT

A linear image sensor includes first and second sensor chips, first and second substrates, a common support substrate, a support portion, a dam portion, and a sealing portion. The first sensor chip is mounted to partially protrude on one end side of the first substrate. The second sensor chip is mounted to partially protrude on one end side of the second substrate. The first and second substrates are mounted on the common support substrate. The support portion is provided in a gap between the end faces of the first and second substrates. The dam portion is provided annularly to surround the sensor chips. The sealing portion seals the sensor chips, in a region surrounded by the dam portion.

12 Claims, 5 Drawing Sheets

(51) Int. Cl.
*H01L 23/28* (2006.01)
*H04N 1/028* (2006.01)
*H01L 25/04* (2014.01)

(52) U.S. Cl.
CPC ............ *H01L 27/146* (2013.01); *H04N 1/028* (2013.01); *Y02P 70/521* (2015.11)

(58) Field of Classification Search
CPC ......... H01L 27/14627; H01L 27/14636; H01L 27/14645; H01L 27/1469; H01L 31/024; H01L 2924/00014; H01L 2224/16227; H01L 24/16; H01L 24/81; H01L 24/85; H01L 25/0657; H01L 2224/0233; H01L 2224/02381; H01L 2224/16148; H01L 2224/85; H01L 2224/81
See application file for complete search history.

Fig.2
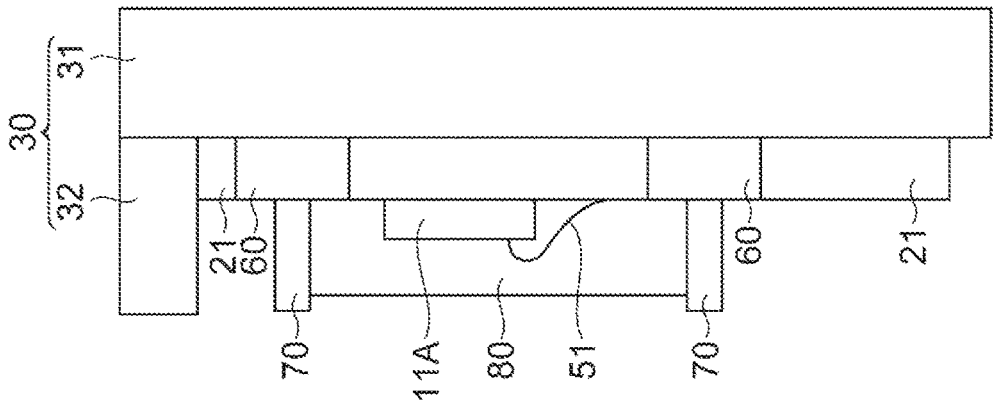
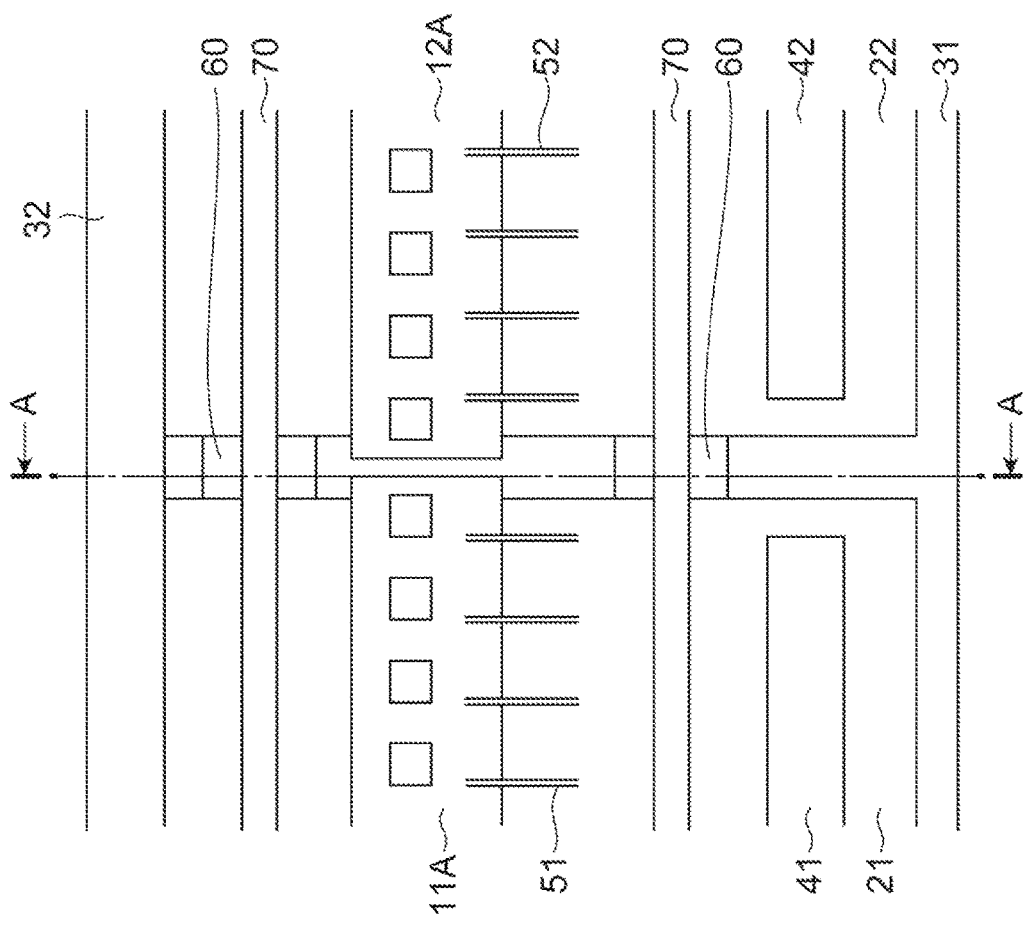

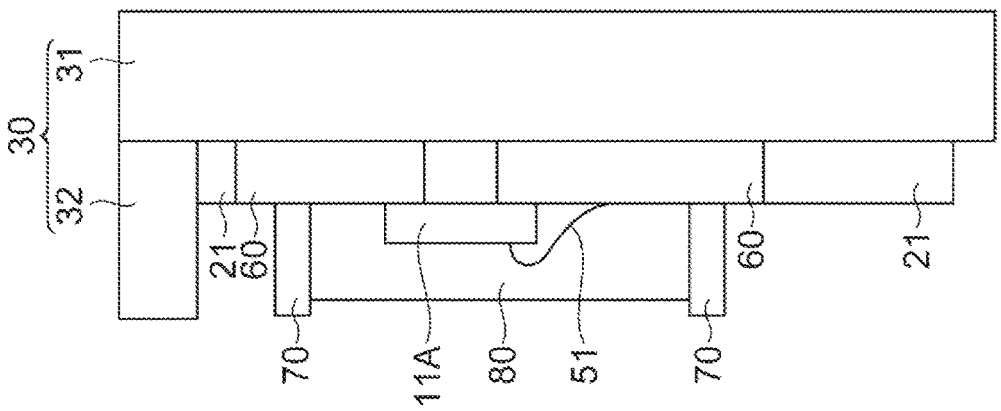
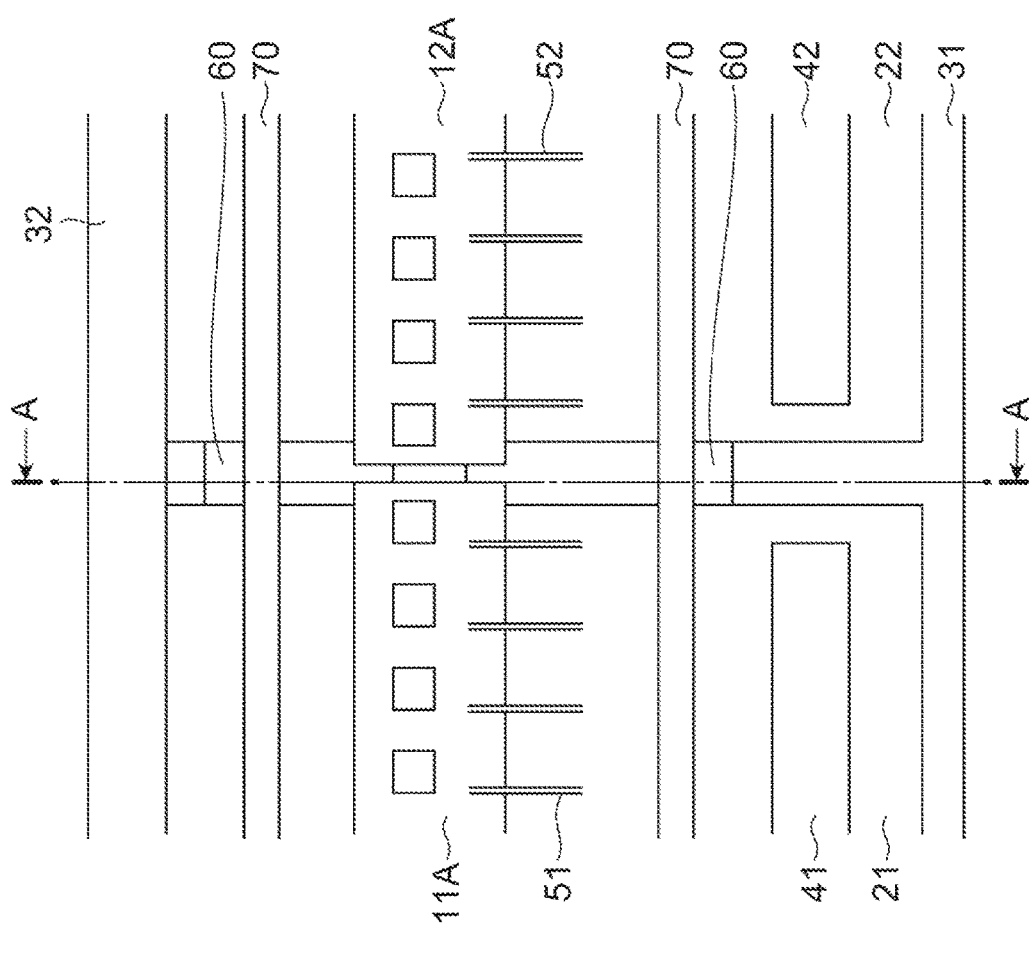

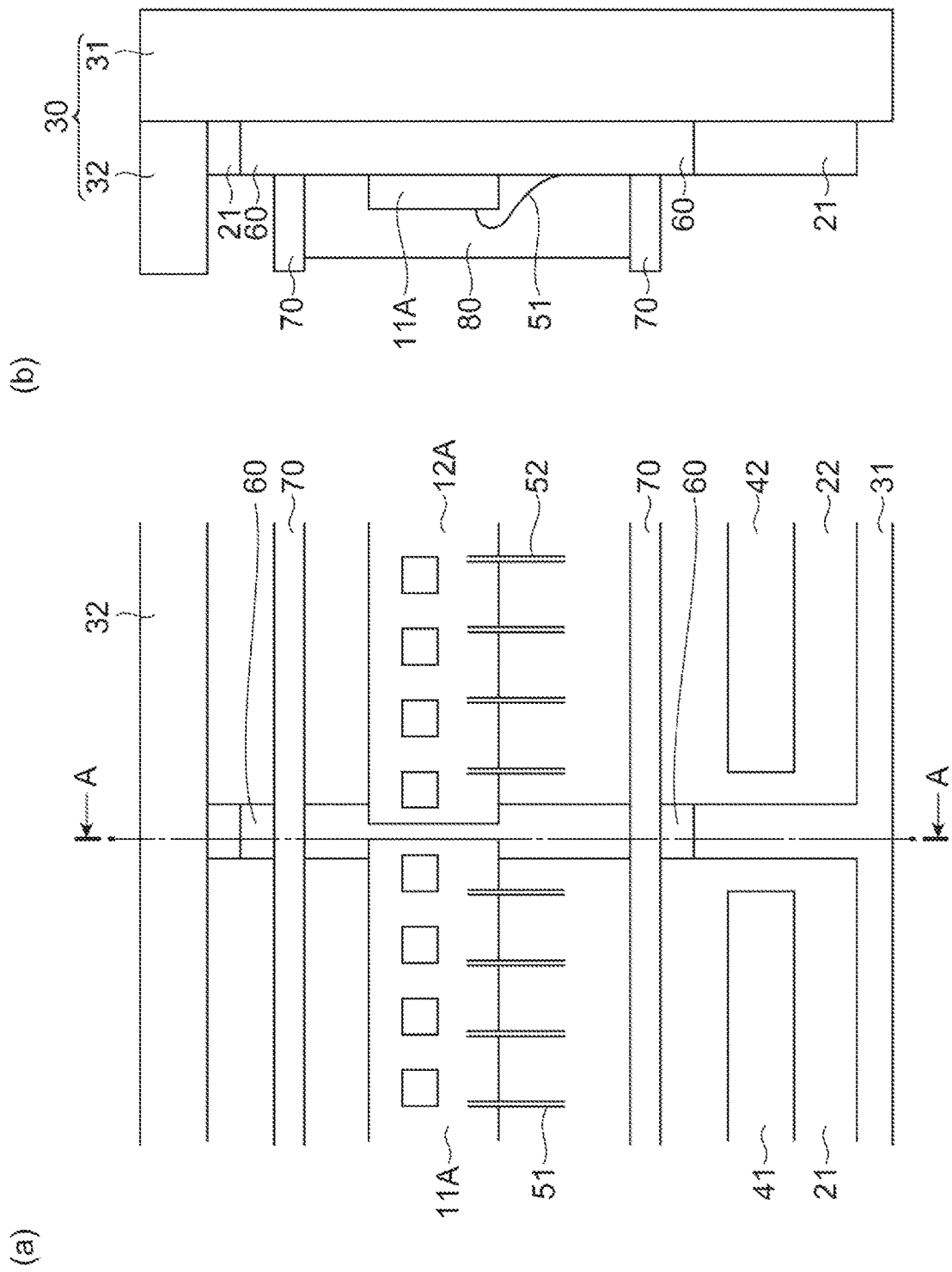

LINEAR IMAGE SENSOR AND METHOD FOR MANUFACTURING SAME

TECHNICAL FIELD

The present invention relates to a linear image sensor and a method for manufacturing the same.

BACKGROUND ART

Lengthening of a linear image sensor including a sensor chip having a plurality of light receiving regions (photodiodes) arranged one-dimensionally is limited due to constraints of a size of a semiconductor wafer and constraints of a manufacturing apparatus, an assembling apparatus, and the like. Therefore, an overall long linear image sensor is realized by disposing a plurality of sensor chips in tandem (see Patent Documents 1 and 2).

CITATION LIST

Patent Literature

Patent Document 1: Japanese Patent Application Laid-Open Publication No. 2013-150311
Patent Document 2: Japanese Patent Application Laid-Open Publication No. S64-82851

SUMMARY OF INVENTION

Technical Problem

In the linear image sensor configured by disposing the plurality of sensor chips in tandem as described above, it is important that the light receiving regions are arranged at a fixed pitch in all of the plurality of sensor chips, and therefore, it is important that the plurality of sensor chips are arranged with high precision. Further, it is important that the plurality of sensor chips and the like are sealed with a sealing portion in order to protect the chips, and in this case, a surface of the sealing portion is flat in order to secure good optical characteristics.

However, in the linear image sensor described in Patent Documents 1 and 2, it is not easy to arrange the plurality of sensor chips with high precision, and further, it is not easy to secure flatness of the surface of the sealing portion.

The present invention has been made to solve the above problem, and an object thereof is to provide a linear image sensor and a method for manufacturing the same in which high precision disposition of a plurality of sensor chips and securing of flatness of a surface of a sealing portion are easy.

Solution to Problem

A linear image sensor according to the present invention includes (1) a first sensor chip including a plurality of light receiving regions arranged one-dimensionally; (2) a second sensor chip including a plurality of light receiving regions arranged one-dimensionally; (3) a first substrate on which the first sensor chip is mounted such that the first sensor chip partially protrudes on one end side; (4) a second substrate on which the second sensor chip is mounted such that the second sensor chip partially protrudes on one end side; (5) a common support substrate on which the first substrate and the second substrate are mounted in a state where the one end side of the first substrate and the one end side of the second substrate face each other; (6) a support portion provided on both sides of the first sensor chip and the second sensor chip in a gap between the one end side of the first substrate and the one end side of the second substrate facing each other; (7) a dam portion provided annularly to surround the first sensor chip and the second sensor chip on the first substrate, the second substrate, and the support portion; and (8) a sealing portion for sealing the first sensor chip and the second sensor chip in a region surrounded by the dam portion.

A linear image sensor manufacturing method according to the present invention includes (1) a first substrate mounting step of mounting a first sensor chip including a plurality of light receiving regions arranged one-dimensionally on a first substrate in a state where the first sensor chip partially protrudes on one end side of the first substrate; (2) a second substrate mounting step of mounting a second sensor chip including a plurality of light receiving regions arranged one-dimensionally on a second substrate in a state where the second sensor chip partially protrudes on one end side of the second substrate; (3) a common support substrate mounting step of, after the first substrate mounting step and the second substrate mounting step, on a common support substrate, causing the one end side of the first substrate and the one end side of the second substrate to face each other, adjusting positions of the first substrate and the second substrate on the basis of the arrangement of the light receiving regions of each of the first sensor chip and the second sensor chip, and mounting the first sensor chip and the second sensor chip; (4) a support portion formation step of, after the common support substrate mounting step, forming a support portion provided on both sides of the first sensor chip and the second sensor chip in a gap between the one end side of the first substrate and the one end side of the second substrate facing each other; (5) a dam portion formation step of, after the support portion formation step, forming a dam portion provided annularly to surround the first sensor chip and the second sensor chip on the first substrate, the second substrate, and the support portion; and (6) a sealing portion formation step of, after the dam portion formation step, forming a sealing portion for sealing the first sensor chip and the second sensor chip in a region surrounded by the dam portion.

Advantageous Effects of Invention

According to the linear image sensor of the present invention, it is easy to dispose a plurality of sensor chips with high precision, and it is easy to secure flatness of the surface of the sealing portion.

BRIEF DESCRIPTION OF DRAWINGS

FIG. 2 includes (a), (b) diagrams illustrating a first configuration example of a main part of the linear image sensor 1 according to the embodiment.

FIG. 3 includes (a), (b) diagrams illustrating a second configuration example of a main part of the linear image sensor 1 according to the embodiment.

FIG. 4 includes (a), (b) diagrams illustrating a third configuration example of a main part of the linear image sensor 1 according to the embodiment.

DESCRIPTION OF EMBODIMENTS

Hereinafter, embodiments for carrying out the present invention will be described in detail with reference to the accompanying drawings. In the description of the drawings, the same elements will be denoted by the same reference signs, without redundant description. The present invention is not limited to these examples.

Figure 1:
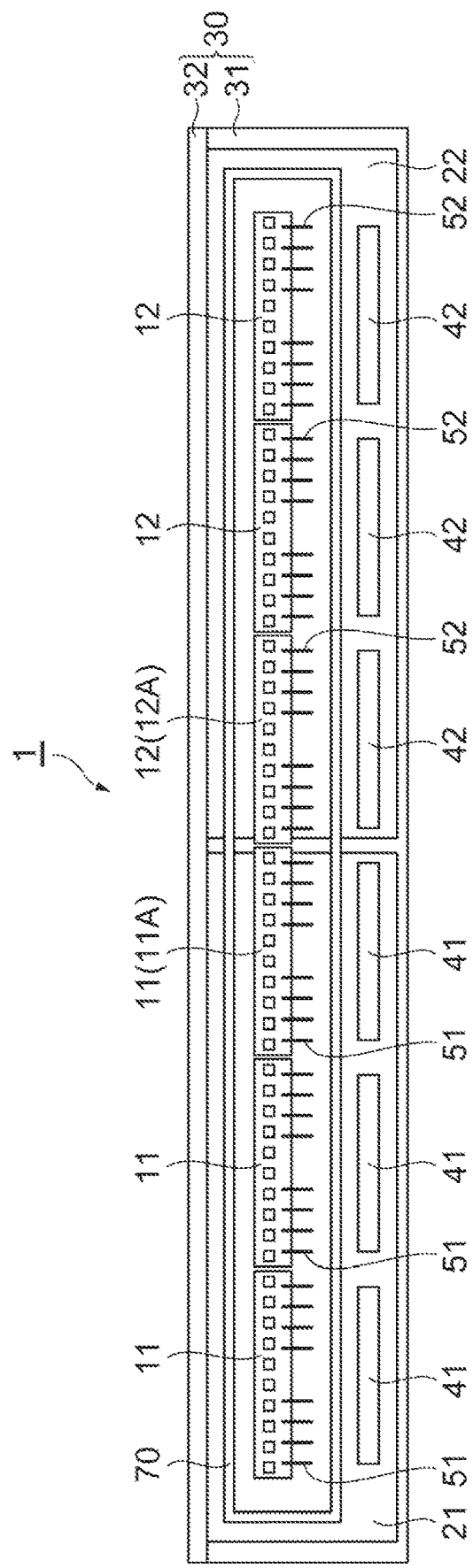
FIG. 1 is a plan view illustrating a schematic configuration of a linear image sensor 1 according to an embodiment.

FIG. 1 is a plan view illustrating a schematic configuration of a linear image sensor 1 according to an embodiment. The linear image sensor 1 includes sensor chips 11, sensor chips 12, a first substrate 21, a second substrate 22, a common support substrate 30, connectors 41, 42, and bonding wires 51, 52, and the like.

Each of the sensor chips 11, 12 is a semiconductor chip including a plurality of light receiving regions (photodiodes) arranged at a fixed pitch in a one-dimensional form. In each of the sensor chips 11, 12, not only a light receiving region, but also a signal readout circuit that accumulates charges generated according to incidence of light to the light receiving region and outputs a voltage value according to the charge accumulation amount and the like may be formed. The sensor chips 11, 12 have the same configuration. Each of the sensor chips 11, 12 includes, for example, a CMOS circuit formed on a silicon substrate.

The sensor chip 11 is mounted on the first substrate 21. The sensor chip 12 is mounted on the second substrate 22. Thicknesses of the first substrate 21 and the second substrate 22 are the same as each other. Each of the first substrate 21 and the second substrate 22 is, for example, a printed substrate of ceramic or glass epoxy.

The number of sensor chips 11 mounted on the first substrate 21 may be one or may be two or more. The number of sensor chips 12 mounted on the second substrate 22 may be one or may be two or more. In the example illustrated in FIG. 1, three sensor chips 11 disposed in tandem are mounted on the first substrate 21, and three sensor chips 12 disposed in tandem are mounted on the second substrate 22.

In addition to the three sensor chips 11, three connectors 41 are also mounted on the first substrate 21. The sensor chips 11 and the connectors 41 are electrically connected by the bonding wires 51 that connect pads of the sensor chips 11 and electrodes on the first substrate 21, and electric wiring formed on the first substrate 21. Here, the number of connectors 41 mounted on the first substrate 21 may be one or two or may be four or more.

In addition to the three sensor chips 12, three connectors 42 are also mounted on the second substrate 22. The sensor chips 12 and the connectors 42 are electrically connected by the bonding wires 52 that connect pads of the sensor chips 12 and electrodes on the second substrate 22, and electrical wiring formed on the second substrate 22. Here, the number of connectors 42 mounted on the second substrate 22 may be one or two or may be four or more.

The first substrate 21 and the second substrate 22 are mounted on the common support substrate 30. The common support substrate 30 includes a flat plate portion 31 long in one direction (a direction in which the light receiving regions of the respective sensor chips are arranged) and a positioning portion 32 provided on an edge of one long side of the flat plate portion 31. The first substrate 21 and the second substrate 22 are mounted on a flat upper surface of the flat plate portion 31, and a position in a short side direction is determined by the positioning portion 32.

The sensor chip (a first sensor chip 11A) located at a position closest to the second substrate 22 among the three sensor chips 11 on the first substrate 21 is mounted to partially protrude on one end side of the first substrate 21 (a side facing the second substrate 22). The sensor chip (a second sensor chip 12A) located at a position closest to the first substrate 21 among the three sensor chips 12 on the second substrate 22 is mounted to partially protrude on one end side of the second substrate 22 (a side facing the first substrate 21). The first substrate 21 and the second substrate 22 are mounted on the common support substrate 30 in a state where the one end side of the first substrate 21 and the one end side of the second substrate 22 face each other. Further, the plurality of light receiving regions of the first sensor chip 11A and the plurality of light receiving regions of the second sensor chip 12A are aligned on a straight line.

That is, in a plan view, a part of the first sensor chip 11A protrudes toward the second substrate 22 side from the side surface of the first substrate 21, and a part of the second sensor chip 12A protrudes toward the first substrate 21 side from the side surface of the second substrate 22. Thus, a gap between the end faces of the first sensor chip 11A and the second sensor chip 12A facing each other is narrower than a gap between the one end side of the first substrate 21 and the one end side of the second substrate 22.

The plurality of light receiving regions of each of the three sensor chips 11 and the three sensor chips 12 are present on a straight line, and the plurality of light receiving regions are arranged at a fixed pitch.

FIG. 2 includes diagrams illustrating a first configuration example of a main part of the linear image sensor 1 of the embodiment. (a) in FIG. 2 is an enlarged plan view illustrating a part near a center of the linear image sensor 1 illustrated in FIG. 1. (b) in FIG. 2 illustrates a cross-section taken along a line AA in (a) in FIG. 2. Hereinafter, the first configuration example of the linear image sensor 1 will be described with reference to FIG. 1 and FIG. 2. The linear image sensor 1 also includes a support portion 60, a dam portion 70, and a sealing portion 80. Here, for convenience of illustration, the support portion 60 and the sealing portion 80 are not illustrated in FIG. 1, and the sealing portion 80 is not illustrated in (a) in FIG. 2.

The support portion 60 is provided on both sides of the first sensor chip 11A and the second sensor chip 12A interposed in the gap between the one end side of the first substrate 21 and the one end side of the second substrate 22 facing each other. The support portion 60 is a separate body from the common support substrate 30. It is preferable for the support portion 60 to be in contact with the respective end faces of the first substrate 21 and the second substrate 22. It is preferable for the support portion 60 to be provided down to an upper surface of the common support substrate 30 and to be in contact with the upper surface of the common support substrate 30. It is preferable for the support portion 60 to be provided up to a position higher than the respective upper surfaces of the first substrate 21 and the second substrate 22, and the support portion may be partially on the respective upper surfaces of the first substrate 21 and the second substrate 22. It is preferable for the support portion 60 to be made of a resin (for example, a silicone resin) which is cured after application.

The dam portion 70 is a frame body provided annularly on the first substrate 21, the second substrate 22, and the support portion 60 to surround the sensor chips 11, 12 and the bonding wires 51, 52. The dam portion 70 is provided up to a position higher than a highest point of objects sealed by the sealing portion 80, and in this configuration example, the dam portion is provided up to a position higher than a highest position of the bonding wires 51, 52. It is preferable for the dam portion 70 to be made of a resin (for example, a silicone resin) which is cured after application. Here, even when there is a gap between the end faces of the first substrate 21 and the second substrate 22 and the support portion 60, the dam portion 70 may be provided continuously on the gap due to a degree of viscosity of the resin.

The sealing portion 80 seals the sensor chips 11, 12 and the bonding wires 51, 52 in a region surrounded by the dam portion 70. An upper surface of the sealing portion 80 is higher than the highest position of the bonding wires 51, 52 and lower than the upper surface of the dam portion 70. The sealing portion 80 has a high transmittance for light of a detection object. It is preferable for the sealing portion 80 to be made of a resin (for example, a silicone resin) which is cured after application. Further, it is preferable for the resin of the sealing portion 80 to have a flat upper surface before curing and for the flatness of the upper surface to be able to be maintained also after curing. Here, even when there is a gap between the end faces of the first substrate 21 and the second substrate 22 and the support portion 60 or even when there is a gap between the upper surface of the common support substrate 30 and the support portion 60, the upper surface of the sealing portion 80 can be flattened according to the degree of viscosity of the resin.

In the first configuration example, the resin of the sealing portion 80 before curing is likely to flow into the gap between the respective end faces of the first substrate 21 and the second substrate 22 facing each other, but outflow of the resin can be suppressed by the support portion 60 provided between the respective end faces of the first substrate 21 and the second substrate 22.

FIG. 3 includes diagrams illustrating a second configuration example of a main part of the linear image sensor 1 of the embodiment. (a) in FIG. 3 is an enlarged plan view illustrating a part near a center of the linear image sensor 1 illustrated in FIG. 1. (b) in FIG. 3 illustrates a cross-section taken along a line AA in (a) in FIG. 3. Hereinafter, the second configuration example of the linear image sensor 1 will be described with reference to FIG. 1 and FIG. 3. Here, for convenience of illustration, the sealing portion 80 is not illustrated in (a) in FIG. 3.

In the first configuration example illustrated in FIG. 2, the support portion 60 is provided on both sides of the first sensor chip 11A and the second sensor chip 12A in the gap between the one end side of the first substrate 21 and the one end side of the second substrate 22 facing each other, but is not provided under the first sensor chip 11A and the second sensor chip 12A. On the other hand, in the second configuration example illustrated in FIG. 3, a part of the support portion 60 is present under each of the first sensor chip 11A and the second sensor chip 12A.

Even in the second configuration example, it is preferable for the support portion 60 to be in contact with the respective end faces of the first substrate 21 and the second substrate 22. It is preferable for the support portion 60 to be provided to the upper surface of the common support substrate 30 and to be in contact with the upper surface of the common support substrate 30. It is preferable for the support portion 60 to be in contact with the respective lower surfaces of the first sensor chip 11A and the second sensor chip 12A. It is preferable for the support portion 60 to be provided up to a position higher than the respective upper surfaces of the first substrate 21 and the second substrate 22 in a region in which the first sensor chip 11A and the second sensor chip 12A are not present, and the support portion may be partially on the respective upper surfaces of the first substrate 21 and the second substrate 22. It is preferable for the support portion 60 to be made of a resin (for example, a silicone resin) which is cured after application.

In the second configuration example, in the region surrounded by the dam portion 70, the resin of the sealing portion 80 before curing is likely to flow into the gap between the respective end faces of the first substrate 21 and the second substrate 22 facing each other, but only into a narrow gap between the respective end faces of the first sensor chip 11A and the second sensor chip 12A facing each other. Therefore, as compared with the first configuration example, in the second configuration example, the flow of the resin into the gap between the respective end faces of the first substrate 21 and the second substrate 22 facing each other can be suppressed more reliably. Therefore, it is easy to secure the flatness of the surface of the sealing portion 80 in the gap portion, and good optical characteristics can be obtained.

FIG. 4 includes diagrams illustrating a third configuration example of a main part of the linear image sensor 1 of the embodiment. (a) in FIG. 4 is an enlarged plan view illustrating a part near a center of the linear image sensor 1 illustrated in FIG. 1. (b) in FIG. 4 illustrates a cross-section taken along a line AA in (a) in FIG. 4. Hereinafter, the third configuration example of the linear image sensor 1 will be described with reference to FIG. 1 and FIG. 4. Here, for convenience of illustration, the sealing portion 80 is not illustrated in (a) in FIG. 4.

In the first configuration example illustrated in FIG. 2 and the second configuration example illustrated in FIG. 3, the support portion 60 is provided and divided into two portions in the gap between the one end side of the first substrate 21 and the one end side of the second substrate 22 facing each other. On the other hand, in the third configuration example illustrated in FIG. 4, the support portion 60 is provided continuously from one side to the other side with respect to the first sensor chip 11A and the second sensor chip 12A in the gap between the one end side of the first substrate 21 and the one end side of the second substrate 22.

Even in the third configuration example, it is preferable for the support portion 60 to be in contact with the respective end faces of the first substrate 21 and the second substrate 22. It is preferable for the support portion 60 to be provided to the upper surface of the common support substrate 30 and to be in contact with the upper surface of the common support substrate 30. It is preferable for the support portion 60 to be in contact with the respective lower surfaces of the first sensor chip 11A and the second sensor chip 12A. It is preferable for the support portion 60 to be provided up to a position higher than the respective upper surfaces of the first substrate 21 and the second substrate 22 in a region in which the first sensor chip 11A and the second sensor chip 12A are not present, and the support portion may be partially on the respective upper surfaces of the first substrate 21 and the second substrate 22. It is preferable for the support portion 60 to be made of a resin (for example, a silicone resin) which is cured after application.

In the third configuration example, in the region surrounded by the dam portion 70, the resin of the sealing portion 80 before curing does not flow into the gap between the respective end faces of the first substrate 21 and the second substrate 22 facing each other. Therefore, the flatness of the surface of the sealing portion 80 is reliably secured in the gap portion, and good optical characteristics can be obtained.

Further, in any of the first to third configuration examples, when the support portion 60, the dam portion 70, and the sealing portion 80 are made of the same resin, boundaries thereof are likely to be unable to be identified. However, the support portion 60, the dam portion 70, and the sealing portion 80 can be distinguished from each other by, for example, regions in which the portions are provided.

That is, the dam portion 70 is a high portion at the periphery, of the resin on the first substrate 21 and the second substrate 22. The sealing portion 80 is a low portion surrounded by the dam portion 70, of the resin on the first substrate 21 and the second substrate 22. Further, the support portion 60 is a portion present under the dam portion 70 and between the respective end faces of the first substrate 21 and the second substrate 22. Here, in general, the sealing portion 80 is formed to be lower than the dam portion 70, but the sealing portion 80 may be formed to be higher than the dam portion 70 according to conditions such as the viscosity of the resin that is used as the sealing portion 80.

Figure 5:
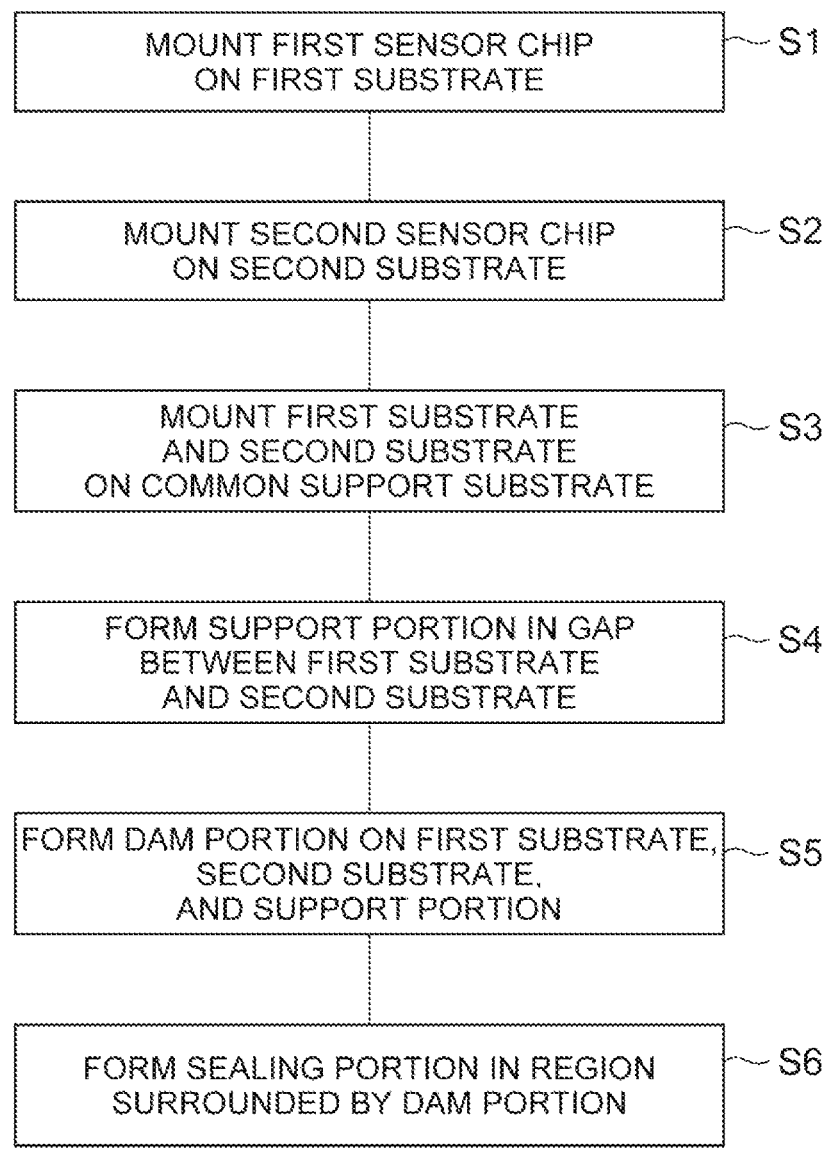
FIG. 5 is a flowchart of a method for manufacturing the linear image sensor 1 according to the embodiment.

Next, a method for manufacturing the linear image sensor 1 according to the embodiment will be described. FIG. 5 is a flowchart of the method for manufacturing the linear image sensor 1 of the embodiment.

In a first substrate mounting step S1, the three sensor chips 11 and the three connectors 41 are mounted on the first substrate 21. In this case, positions and orientations of the three sensor chips 11 mounted on the first substrate 21 are adjusted so that the respective light receiving regions are aligned on a straight line at a fixed pitch in all of the three sensor chips 11. The first sensor chip 11A on the one end side of the first substrate 21, among the three sensor chips 11 mounted on the first substrate 21, is mounted to partially protrude from the first substrate 21. Further, the pads of the sensor chips 11 and the electrodes on the first substrate 21 are connected by the bonding wires 51. The connectors 41 may be mounted in another step (any one of steps of S1 to S6 or thereafter).

Similarly, in a second substrate mounting step S2, the three sensor chips 12 and the three connectors 42 are mounted on the second substrate 22. In this case, positions and orientations of the three sensor chips 12 mounted on the second substrate 22 are adjusted so that the respective light receiving regions are aligned on a straight line at a fixed pitch in all of the three sensor chips 12. The second sensor chip 12A on the one end side of the second substrate 22, among the three sensor chips 12 mounted on the second substrate 22, is mounted to partially protrude from the second substrate 22. Further, the pads of the sensor chips 12 and the electrodes on the second substrate 22 are connected by the bonding wires 52. The connectors 42 may be mounted in another step (any one of steps of S1 to S6 or thereafter).

After the first substrate mounting step S1 and the second substrate mounting step S2, a common support substrate mounting step S3 is performed. In the common support substrate mounting step S3, on the common support substrate 30, the first substrate 21 with the three sensor chips 11 and the three connectors 41 mounted thereon is mounted, and farther, the second substrate 22 with the three sensor chips 12 and the three connectors 42 mounted thereon is mounted. In this case, the one end side of the first substrate 21 and the one end side of the second substrate 22 are caused to face each other, and respective positions and orientations of the first substrate 21 and the second substrate 22 are adjusted so that the respective light receiving regions in a total of six sensor chips 11, 12 are aligned on a straight line at a fixed pitch.

In the common support substrate mounting step S3, respective positions and orientations in the short side direction of the first substrate 21 and the second substrate 22 can be set appropriately by causing the first substrate 21 and the second substrate 22 to be brought into contact with the positioning portion 32 of the common support substrate 30. Respective positions in the long side direction of the first substrate 21 and the second substrate 22 (that is, a distance between the first sensor chip 11A and the second sensor chip 12A) can be adjusted by monitoring positions of the light receiving regions of both the sensor chips and the distance between both the sensor chips. This adjustment may be performed manually on the basis of visual observation or may be performed automatically on the basis of a result of image analysis.

After the common support substrate mounting step S3, a support portion formation step S4 is performed. In the support portion formation step S4, the support portion 60 is formed by applying a resin to both sides of the first sensor chip 11A and the second sensor chip 12A in the gap between the first substrate 21 and the second substrate 22 mounted to face each other on the common support substrate 30, and curing the resin.

In the support portion formation step S4, it is preferable for the support portion 60 to be formed to be in contact with the respective end faces of the first substrate 21 and the second substrate 22. It is preferable for the support portion 60 to be formed down to the upper surface of the common support substrate 30 and in contact with the upper surface of the common support substrate 30. It is preferable for the support portion 60 to be provided up to a position higher than the respective upper surfaces of the first substrate 21 and the second substrate 22, and the support portion may be partially provided on the respective upper surfaces of the first substrate 21 and the second substrate 22. Further, the support portion 60 may be formed as in the second configuration example or the third configuration example.

After the support portion formation step S4, a dam portion formation step S5 is performed. In the dam portion formation step S5, the dam portion 70 is formed by annularly applying a resin to surround the sensor chips 11, 12 and the bonding wires 51, 52 and curing the resin, on the first substrate 21, the second substrate 22, and the support portion 60. In this case, a height of the dam portion 70 is higher than the highest position of the bonding wires 51, 52.

After the dam portion formation step S5, a sealing portion formation step S6 is performed. In the sealing portion formation step S6, a resin is applied to a region surrounded by the dam portion 70, and the resin is cured so that the sealing portion 80 is formed. In this case, the upper surface of the sealing portion 80 is higher than the highest position of the bonding wires 51, 52 and lower than the upper surface of the dam portion 70.

As described above, in the embodiment, the first sensor chip 11A is mounted to partially protrude from the first substrate 21, the second sensor chip 12A is mounted to partially protrude from the second substrate 22, and direct position adjustment of the first sensor chip 11A and the second sensor chip 12A is performed for manufacture, and therefore, it is easy to dispose the plurality of sensor chips 11, 12 with high precision.

As a result, in the embodiment, the gap is generated between the first substrate 21 and the second substrate 22, however, since the support portion 60 is provided in the gap, and the dam portion 70 is provided continuously to surround the sensor chips 11, 12 on the first substrate 21 and the second substrate 22, and further on the support portion 60, flowing of the resin before curing of the sealing portion 80 into the gap is suppressed, it is easy to secure the flatness of the surface of the sealing portion 80 in the gap portion, and it is possible to have good optical characteristics.

Further, in the linear image sensor described in Patent Document 1, a first substrate and a second substrate are brought into contact with a protruded portion (a distance holding portion) provided on a common support substrate, so that the first substrate and the second substrate are positioned. The accuracy of shapes and dimensions of the common support substrate, the first substrate, and the second substrate generally formed of a resin or ceramic is lower than the accuracy of a shape and a dimension of a sensor chip generally manufactured through a semiconductor manufacturing process. Therefore, in the linear image sensor described in Patent Document 1, it is not easy to dispose a plurality of sensor chips with high precision.

The present invention is not limited to the above embodiment, and various modifications are possible. For example, the number of substrates (printed substrates) on which the sensor chips are mounted is two in the above embodiment, but may be three or more. In general, in a case in which N substrates are on a common support substrate, a positional relationship between two arbitrary adjacent substrates may be determined as in the above embodiment, a support portion may be provided in a gap between the substrates, and a dam portion may be provided annularly to surround all the sensor chips on the N substrates and the support portion.

The linear image sensor according to the above embodiment is configured to include (1) a first sensor chip including a plurality of light receiving regions arranged one-dimensionally, (2) a second sensor chip including a plurality of light receiving regions arranged one-dimensionally, (3) a first substrate on which the first sensor chip is mounted such that the first sensor chip partially protrudes on one end side, (4) a second substrate on which the second sensor chip is mounted such that the second sensor chip partially protrudes on one end side, (5) a common support substrate on which the first substrate and the second substrate are mounted in a state where the one end side of the first substrate and the one end side of the second substrate face each other, (6) a support portion provided on both sides of the first sensor chip and the second sensor chip in a gap between the one end side of the first substrate and the one end side of the second substrate facing each other, (7) a dam portion provided annularly to surround the first sensor chip and the second sensor chip on the first substrate, the second substrate, and the support portion, and (8) a sealing portion for sealing the first sensor chip and the second sensor chip in a region surrounded by the dam portion.

In the linear image sensor of the above configuration, the first substrate may include another sensor chip (a third sensor chip) including a plurality of light receiving regions arranged one-dimensionally mounted thereon, in addition to the first sensor chip, the second substrate may include another sensor chip (a fourth sensor chip) including a plurality of light receiving regions arranged one-dimensionally mounted thereon, in addition to the second sensor chip, the dam portion may be provided annularly to surround the other sensor chips (the third and fourth sensor chips) in addition to the first sensor chip and the second sensor chip, and the sealing portion may seal the other sensor chips (the third and fourth sensor chips) in addition to the first sensor chip and the second sensor chip in the region surrounded by the dam portion.

In the linear image sensor of the above configuration, the support portion may be provided continuously from one side to the other side for the first sensor chip and the second sensor chip in the gap.

Further, in the linear image sensor of the above configuration, the support portion may be provided to an upper surface of the common support substrate.

Further, in the linear image sensor of the above configuration, each of the support portion, the dam portion, and the sealing portion may be made of a resin.

Further, in the linear image sensor of the above configuration, the plurality of light receiving regions of the first sensor chip and the plurality of light receiving regions of the second sensor chip may be aligned on a straight line.

A linear image sensor manufacturing method according to the above embodiment is configured to include (1) a first substrate mounting step of mounting a first sensor chip including a plurality of light receiving regions arranged one-dimensionally on a first substrate in a state where the first sensor chip partially protrudes on one end side of the first substrate, (2) a second substrate mounting step of mounting a second sensor chip including a plurality of light receiving regions arranged one-dimensionally on a second substrate in a state where the second sensor chip partially protrudes on one end side of the second substrate, (3) a common support substrate mounting step of, after the first substrate mounting step and the second substrate mounting step, on a common support substrate, causing the one end side of the first substrate and the one end side of the second substrate to face each other, adjusting positions of the first substrate and the second substrate on the basis of the arrangement of the light receiving regions of each of the first sensor chip and the second sensor chip, and mounting the first sensor chip and the second sensor chip, (4) a support portion formation step of, after the common support substrate mounting step, forming a support portion provided on both sides of the first sensor chip and the second sensor chip in a gap between the one end side of the first substrate and the one end side of the second substrate facing each other, (5) a dam portion formation step of, after the support portion formation step, forming a dam portion provided annularly to surround the first sensor chip and the second sensor chip on the first substrate, the second substrate, and the support portion, and (6) a sealing portion formation step of, after the dam portion formation step, forming a sealing portion for sealing the first sensor chip and the second sensor chip in a region surrounded by the dam portion.

In the linear image sensor manufacturing method of the above configuration, the first substrate mounting step may include mounting another sensor chip (a third sensor chip) including a plurality of light receiving regions arranged one-dimensionally on the first substrate in addition to the first sensor chip, the second substrate mounting step may include mounting another sensor chip (a fourth sensor chip) including a plurality of light receiving regions arranged one-dimensionally on the second substrate in addition to the second sensor chip, the dam portion formation step may include forming the dam portion provided annularly to surround the other sensor chips (the third and fourth sensor chips) in addition to the first sensor chip and the second sensor chip, and the sealing portion formation step may include forming the sealing portion for sealing the other sensor chips (the third and fourth sensor chips) in addition to the first sensor chip and the second sensor chip in the region surrounded by the dam portion.

In the linear image sensor manufacturing method of the above configuration, the support portion formation step may include forming the support portion continuously from one side to the other side for the first sensor chip and the second sensor chip in the gap.

Further, in the linear image sensor manufacturing method of the above configuration, the support portion formation step may include forming the support portion to an upper surface of the common support substrate.

Further, in the linear image sensor manufacturing method of the above configuration, a resin may be used as each of the support portion, the dam portion, and the sealing portion.

Further, in the linear image sensor manufacturing method of the above configuration, the common support substrate mounting step may include adjusting the positions of the first substrate and the second substrate so that the plurality of light receiving regions of the first sensor chip and the plurality of light receiving regions of the second sensor chip are aligned on a straight line.

INDUSTRIAL APPLICABILITY

The present invention can be used as a linear image sensor and a method for manufacturing the same in which high precision disposition of a plurality of sensor chips and securing of flatness of a surface of a sealing portion are easy.

REFERENCE SIGNS LIST

1—linear image sensor, 11—sensor chip, 11A—first sensor chip, 12—sensor chip, 12A—second sensor chip, 21—first substrate, 22—second substrate, 30—common support substrate, 41, 42—connector, 51, 52—bonding wire, 60—support portion, 70—dam portion, 80—sealing portion.

The invention claimed is:

1. A linear image sensor comprising:
a first sensor chip including a plurality of light receiving regions arranged one-dimensionally;
a second sensor chip including a plurality of light receiving regions arranged one-dimensionally;
a first substrate on which the first sensor chip is mounted such that the first sensor chip partially protrudes on one end side;
a second substrate on which the second sensor chip is mounted such that the second sensor chip partially protrudes on one end side;
a common support substrate on which the first substrate and the second substrate are mounted in a state where the one end side of the first substrate and the one end side of the second substrate face each other;
a support portion provided on both sides of the first sensor chip and the second sensor chip in a gap between the one end side of the first substrate and the one end side of the second substrate facing each other;
a dam portion provided annularly to surround the first sensor chip and the second sensor chip on the first substrate, the second substrate, and the support portion; and
a sealing portion configured to seal the first sensor chip and the second sensor chip in a region surrounded by the dam portion.

2. The linear image sensor according to claim 1, wherein
the first substrate includes another sensor chip including a plurality of light receiving regions arranged one-dimensionally mounted thereon, in addition to the first sensor chip;
the second substrate includes another sensor chip including a plurality of light receiving regions arranged one-dimensionally mounted thereon, in addition to the second sensor chip;
the dam portion is provided annularly to surround the other sensor chips in addition to the first sensor chip and the second sensor chip; and
the sealing portion is configured to seal the other sensor chips in addition to the first sensor chip and the second sensor chip in the region surrounded by the dam portion.

3. The linear image sensor according to claim 1, wherein the support portion is provided continuously from one side to the other side for the first sensor chip and the second sensor chip in the gap.

4. The linear image sensor according to claim 1, wherein the support portion is provided to an upper surface of the common support substrate.

5. The linear image sensor according to claim 1, wherein each of the support portion, the dam portion, and the sealing portion is made of a resin.

6. The linear image sensor according to claim 1, wherein the plurality of light receiving regions of the first sensor chip and the plurality of light receiving regions of the second sensor chip are aligned on a straight line.

7. A linear image sensor manufacturing method comprising:
a first substrate mounting step of mounting a first sensor chip including a plurality of light receiving regions arranged one-dimensionally on a first substrate in a state where the first sensor chip partially protrudes on one end side of the first substrate;
a second substrate mounting step of mounting a second sensor chip including a plurality of light receiving regions arranged one-dimensionally on a second substrate in a state where the second sensor chip partially protrudes on one end side of the second substrate;
a common support substrate mounting step of, after the first substrate mounting step and the second substrate mounting step, on a common support substrate, causing the one end side of the first substrate and the one end side of the second substrate to face each other, adjusting positions of the first substrate and the second substrate on the basis of the arrangement of the light receiving regions of each of the first sensor chip and the second sensor chip, and mounting the first sensor chip and the second sensor chip;
a support portion formation step of, after the common support substrate mounting step, forming a support portion provided on both sides of the first sensor chip and the second sensor chip in a gap between the one end side of the first substrate and the one end side of the second substrate facing each other;
a dam portion formation step of, after the support portion formation step, forming a dam portion provided annularly to surround the first sensor chip and the second sensor chip on the first substrate, the second substrate, and the support portion; and
a sealing portion formation step of, after the dam portion formation step, forming a sealing portion configured to seal the first sensor chip and the second sensor chip in a region surrounded by the dam portion.

8. The linear image sensor manufacturing method according to claim 7, wherein:
the first substrate mounting step includes mounting another sensor chip including a plurality of light receiving regions arranged one-dimensionally on the first substrate, in addition to the first sensor chip,
the second substrate mounting step includes mounting another sensor chip including a plurality of light receiving regions arranged one-dimensionally on the second substrate, in addition to the second sensor chip,
the dam portion formation step includes forming the dam portion provided annularly to surround the other sensor chips in addition to the first sensor chip and the second sensor chip, and
the sealing portion formation step includes forming the sealing portion configured to seal the other sensor chips in addition to the first sensor chip and the second sensor chip in the region surrounded by the dam portion.

9. The linear image sensor manufacturing method according to claim 7, wherein the support portion formation step includes forming the support portion continuously from one side to the other side for the first sensor chip and the second sensor chip in the gap.

10. The linear image sensor manufacturing method according to claim 7, wherein the support portion formation step includes forming the support portion to an upper surface of the common support substrate.

11. The linear image sensor manufacturing method according to claim 7, wherein a resin is used as each of the support portion, the dam portion, and the sealing portion.

12. The linear image sensor manufacturing method according to claim 7, wherein the common support substrate mounting step includes adjusting the positions of the first substrate and the second substrate so that the plurality of light receiving regions of the first sensor chip and the plurality of light receiving regions of the second sensor chip are aligned on a straight line.

* * * * *